United States Patent [19]

Levi et al.

[11] Patent Number: 5,099,489
[45] Date of Patent: Mar. 24, 1992

[54] APPARATUS COMPRISING A QUANTUM WELL DEVICE

[75] Inventors: Anthony F. J. Levi, Summit, N.J.; Ronald A. Nordin, Naperville, Ill.; Richard N. Nottenburg, New York, N.Y.

[73] Assignee: AT&T Bell Laboratories, Murray Hill, N.J.

[21] Appl. No.: 464,268

[22] Filed: Jan. 12, 1990

Related U.S. Application Data

[63] Continuation-in-part of Ser. No. 407,608, Sep. 15, 1989, Pat. No. 5,023,878.

[51] Int. Cl.$^5$ ............................................. H01S 3/096
[52] U.S. Cl. .................................... 372/38; 372/8; 372/26
[58] Field of Search ...................... 372/38, 50, 8, 26

[56] References Cited

U.S. PATENT DOCUMENTS 3,727,061  4/1973  Dworkin ................................. 372/8
4,689,793  8/1987  Liu et al. ................................ 372/8

OTHER PUBLICATIONS

Yanai et al., "Direct Modulation of a Double-Heterostructure Laser Using a Schottky-Barrier-Gate Gunn--Effect Digital Device", *IEEE* JQE, vol. QE-11, No. 7, Jul. 1975, pp. 519-524.
Kozlyayev et al., "The Use of Injection-Laser Logic--Elements in Optical Communications Systems with Time Multiplexing", *Radio Engineering and Electronic Physics,* vol. 15, No. 4 (1970), pp. 652-656.
Copeland, "Triggerable Semiconductor Lasers and Light-Coupled Logic", J. Appl. Phys. 51(4), Apr. 1980, pp. 1919-1921.

*Primary Examiner*—James W. Davie
*Attorney, Agent, or Firm*—E. E. Pacher

[57] ABSTRACT

Disclosed is apparatus, exemplarily an electronic switching machine, that comprises novel and advantageous optical interconnection means. In particular, the apparatus comprises one or more digital electronic gates, and the output of the gate or gates is applied, without intervening amplifications, to a semiconductor laser whose radiation output is responsive to the applied electrical signal. The laser exemplarily is a quantum well laser of the type disclosed in U.S. patent application Ser. No. 407,608, U.S. Pat. No. 5,023,878, comprising at least one gain section and at least one loss section. The electrical output of the gate or gates is connected to the at least one loss section. Due to the ability of such lasers to be switched by means of a relatively very small current through the loss section, conventionally used drive amplifiers are not required in apparatus according to the invention, resulting in significantly reduced complexity and cost.

3 Claims, 6 Drawing Sheets

20: $I_A = +15mA$
21: $V_A = -0.2V$
22: $V_A = -1V$ $I_G = 245$ mA
$I_A = +20$ mA

APPARATUS COMPRISING A QUANTUM WELL DEVICE

CROSS-REFERENCE TO RELATED APPLICATION

This application is a continuation-in-part of copending application, Ser. No. 407,608, filed Sept. 15, 1989, now U.S. Pat. No. 5,023,878.

FIELD OF THE INVENTION

This invention pertains to devices such as semiconductor lasers and laser amplifiers, and in particular, to such devices comprising a quantum well or quantum wells, to apparatus comprising such devices, and to methods of operating such apparatus.

BACKGROUND OF THE INVENTION

Semiconductor lasers are finding use in a variety of fields of technology. For instance, such lasers have found wide use in optical fiber communication systems. The operating speed of optical fiber communication systems has increased dramatically, to the point where at least one commercially available system operates in the Gigahertz range. The trend towards higher and higher operating speed is expected to continue. Thus it would be highly desirable to have available semiconductor lasers that allow simple high speed modulation of their output.

In addition to increasing information throughput through an increase in the bit rate at a single, predetermined wavelength, thought is also being given to increasing throughput through wavelength division multiplexing. For this application it would be desirable to have available semiconductor lasers that can operate at more than one wavelength, and in particular, that can be switched rapidly between two (and possibly more) wavelengths. Such lasers would also be of interest for application in optical information storage systems, especially if the two output wavelengths are relatively widely separated. For instance, the longer of the two wavelengths could be used to "read" stored information, and the shorter could be used to "write" information into the storage medium.

Lasers that emit at two wavelengths are known to the art. See, for instance, N. K. Dutta et al., *Applied Physics Letters*, Vol. 48 (25), pp. 1725–1726; H. E. Maes et al., *Electronics Letters*, Vol. 18(9), pp. 372–374; and Y. Tokuda et al., *Applied Physics Letters*, Vol. 51 (21), pp. 1664–1666. These publications disclose lasers comprising two separate and independent active regions, one for each wavelength. Such devices are difficult to manufacture and thus can be expected to be costly.

A particular kind of semiconductor laser known to the prior art is the so-called "quantum well" laser. See for instance W. T. Tsang et al., *IEEE Journal of Quantum Electronics*, Vol. QE-20 (10), pp. 1119–1132 (incorporated herein by reference), wherein quantum well lasers (including single quantum well lasers) and their growth by molecular beam epitaxy are discussed. See also N. B. Patel et al., *IEEE Journal of Quantum Electronics*, Vol. QE-23 (6), pp. 988–992, which discusses threshold current considerations in graded barrier single quantum well lasers.

M. Mittelstein et al., *Applied Physics Letters*, Vol. 49(25), pp. 1689–1691, report that, by cleaving single quantum well lasers to progressively shorter lengths (spanning the length 70–470 $\mu$m) it is possible to change the lasing wavelength. As is well known, the (modal) gain of a laser is a function of the length of the active region of the laser. Thus, cleaving otherwise identical lasers to shorter and shorter lengths results in lasers having lower and lower modal gain. This gain is conventionally measured in wave numbers (cm$^{-1}$). Mittelstein et al. report an abrupt change in lasing wavelength at about 100 cm$^{-1}$. This change was identified with the onset of lasing from the second sub-band of the quantum well.

Q-switching, well known in dye lasers, is also known in semiconductor lasers. See, for instance, D. Z. Tsang et al., *Applied Physics Letters*, Vol. 45 (3), pp. 204–206, which discloses a Q-switched laser comprising an amplifier section and, electrically substantially isolated therefrom, a modulator section. The length of the former is in the range 150–250 $\mu$m, and of the latter in the range 25–75 $\mu$m. A "waveguide" section between the amplifier and modulator sections is 25 $\mu$m long. The gain of the laser cavity can be changed by changing the (reverse) electrical bias on the modulator section, making possible amplitude modulation of the laser output. The paper reports that devices have been continuously operated with full on/off modulation rates of 10 GHz.

Amplitude modulation by means of Q-switching of a multi-quantum well laser with an intra-cavity monolithic loss modulator has also been reported by Y. Arakawa et al., *Applied Physics Letters*, Vol. 48 (9), pp. 561–563. These workers too report on a semiconductor laser comprising an amplifier section and, electrically substantially isolated therefrom, a modulator section. The lengths of the amplifier and modulator sections were 250 and 50 $\mu$m, respectively, and the resistance between the two sections was 5 k$\Omega$. Varying the electrical bias on the modulator section resulted in amplitude variation of the radiation emitted by the device.

Y. Tokuda et al., *Applied Physics Letters*, Vol. 49(24), pp. 1629–1631, have produced wavelength switching in a single quantum well laser by means of appropriate variation of the injection current. Since the change in the current involved is typically relatively large, it can be expected that the switching is attended by substantial chirp of the output radiation.

For reasons discussed at least in part above, it would be highly desirable to have available a semiconductor laser whose radiation output could be easily and rapidly modulated and/or switched between two predetermined wavelengths, especially relatively widely separated wavelengths. This application discloses such a laser. It also discloses a method of operating such a laser, and further discloses a laser amplifier having advantageous features.

Semiconductor lasers are being used in means for interconnecting electronic systems, subsystems and/or components, e.g., means for interconnecting two or more circuit boards that are part of apparatus such as an electronic switching machine. It has been recognized previously that optical interconnection can permit increased operating speed and can result in a less crowded (and thus more "transparent") "backplane".

In apparatus that comprises optical interconnection means, these means typically comprise a semiconductor laser whose radiation output is modulated (typically switched on/off) in accordance with an electrical signal that appears at some appropriate point on a first electronic assembly or subassembly. The radiation output of the laser typically is coupled into an optical fiber (although free-space optical communication is in principle also possible), transmitted through the fiber to one or more downstream locations where the radiation is caused to impinge on a detector which produces an electrical signal in response to the radiation incident on the detector. The thus produced electrical signal can form (with or without conditioning and/or other processing) an input to a second electronic assembly or subassembly.

Generally, the first assembly or subassembly comprises a digital gate whose output serves as the input to amplifying means that serve to provide the relatively large current required to modulate the laser output in accordance with the output of the digital gate. Such output amplifiers are well known in the art and constitute a significant cost item in optical interconnection schemes.

In view of the cost and other disadvantages associated with prior art optical interconnection schemes it would be highly desirable to have available optical interconnection means that are not subject to the disadvantages that follow from the need to use output amplifiers. This application discloses such interconnection means.

SUMMARY OF THE INVENTION

In a broad aspect the invention is apparatus that comprises a quantum well device that comprises a monolithically integrated intra-cavity loss modulator, and a method of operating such apparatus. Devices according to the invention thus comprise, in addition to one or more "gain section", one or more "loss section". By varying the bias conditions on the loss section (which is electrically substantially isolated from the gain section) the modal gain of the structure can be varied. The bias conditions typically are varied by varying of the electrical bias on the loss section, but can also be varied by optical pumping of the loss section.

Devices according to the invention can be used in a variety of ways, including as Q-switched radiation sources, as variable gain amplifiers, and as wavelength-switchable radiation sources.

In a particular embodiment, the inventive apparatus comprises a quantum well device with $L_C/L_A > 20$, where $L_C$ and $L_A$ are the total length of the optical cavity of the device and of the loss section(s), respectively, and with the isolation resistance between the loss section(s) and the gain section(s) being at least about 3 kΩ. With, exemplarily, appropriate reflection layers applied to the facets of such a structure the device can be used as a fast Q-switchable laser. With appropriate anti-reflection coatings applied, the device can be used as a fast variable-gain laser amplifier.

More specifically, in a particular aspect the invention is embodied in apparatus that comprises a laser, the laser comprising a semiconductor body having a gain section and, optically coupled to the gain section but electrically substantially isolated therefrom, a loss section of length $L_A$. The apparatus further comprises means for causing the flow of an electrical current through the gain section, and means for electrically biasing the loss section. The body comprises at least one quantum well. Associated with the body is a gain for radiation of a given wavelength. The radiation generally is due to lasing from one of the sub-bands associated with the quantum well or wells. The apparatus typically also comprises means for utilizing the radiation emitted by the laser. Significantly, in the particular embodiment $L_C/L_A$ is greater than 20, where $L_C$ is the distance between the facets of the laser. Furthermore, the electrical isolation resistance between the gain section and the loss section is at least about 3 kΩ. In these inventive devices the gain for the radiation can be readily changed by changing the loss section bias, making possible fast amplitude modulation of the laser radiation. The loss section bias is typically changed by changing the electrical bias on the loss section but can also be changed by optical pumping of the loss section.

In a further aspect the invention is embodied in apparatus that comprises an optical amplifier. The amplifier comprises a semiconductor body having two faces, with an anti-reflection coating for a given wavelength on at least one of the faces. Associated with the body is a gain for radiation of the given wavelength, and the body comprises at least one quantum well. The apparatus further comprises means for impinging radiation of the given wavelength on one of the faces, and means for utilizing radiation of the given wavelength emitted from the other of the faces. Significantly, the body comprises a gain section and, optically coupled to the gain section but electrically substantially isolated therefrom, a loss section of length $L_A$. The apparatus further comprises means for changing the gain for radiation of the given wavelength, the means comprising means for applying an electrical bias to the loss section. It also comprises means for causing the flow of an electrical current through the gain section. The inventive optical amplifier can have variable gain, achieved through varying the bias on the loss section. The bias can be varied electrically, and/or through optical pumping of the loss section. In preferred embodiments $L_C/L_A > 20$, where $L_C$ is the length of the body. Typically, the isolation resistance between gain section and loss section is greater than 3 kΩ, preferably greater than 100 kΩ or even 1MΩ.

In a still further aspect the invention is embodied in apparatus that comprises a semiconductor body comprising a gain section and, optically coupled to the gain section but electrically substantially isolated therefrom, a loss section. The body has length $L_C$, and associated with the body is a gain for radiation of a given wavelength. The apparatus also comprises means for causing the flow of an electrical current through the gain section, means for changing the gain for radiation of the given wavelength (comprising means for applying an electrical bias to the loss section), and means for utilizing radiation emitted by the laser. The semiconductor body comprises at least one quantum well, and associated with the quantum well is a first and a second energy sub-band. Significantly, the means for changing the gain are adapted for changing the gain, without changing $L_C$, from a first value that is associated with the emission of first radiation of wavelength $\lambda_1$ to a second value associated with emission of second radiation of wavelength $\lambda_2$ ($|\lambda_1 - \lambda_2|$ at least about 10 nm). Frequently, the first radiation is associated with electronic transitions from one of the first and second sub-bands, and the second radiation is associated with electronic transitions from the other of the first and second sub-bands. However, this is not necessarily so, and large wavelength shifts can also be achieved within a given sub-band. The gain is changed by changing the electrical bias on, and/or by optically pumping, the loss section.

The invention is also embodied in a method of using apparatus as described above. The method comprises causing the flow of an electrical current through the loss section, and electrically biasing the loss section such that the laser emits first radiation of wavelength $\lambda_1$. The method further comprises changing the gain of the body for first radiation (without changing the length of the body), such that the laser emits second radiation of wavelength $\lambda_2$, with $|\lambda_1-\lambda_2|$ being at least 10 nm.

In a particular embodiment lasers according to the invention are used in apparatus comprising optical interconnection means.

The apparatus comprises at least one digital gate (exemplarily formed in ECL, MOS or C-MOS technology) having an electrical output, the output being electrically connected, without intervening amplifier, to the loss section of the multi-electrode laser, with the output of the gate being such that the laser output can be switched between a relatively low value (exemplarily about zero intensity) and a relatively high value (exemplarily more than 1 $\mu$W of radiation power).

Currently preferred apparatus according to the invention comprises a multiplicity of digital gates ($G_1$, $G_2$, ... $G_n$; $n \geq 2$), means for combining the outputs of the gates into a multiplexed electrical signal, means for applying, without amplification, the multiplexed electrical signal to the loss section of the multi-electrode laser, optical fiber means, means for detecting laser radiation transmitted through the fiber means, means for demultiplexing the electrical output of the detector means, and an electronic assembly, subassembly or device that is responsive to at least one of the demultiplexed electrical signals.

BRIEF DESCRIPTION OF THE DRAWINGS

Analogous elements are identified by the same numeral in different figures. No attempt is made to show true dimensions and/or proportions.

DETAILED DESCRIPTION OF SOME PREFERRED EMBODIMENTS

Figure 1:
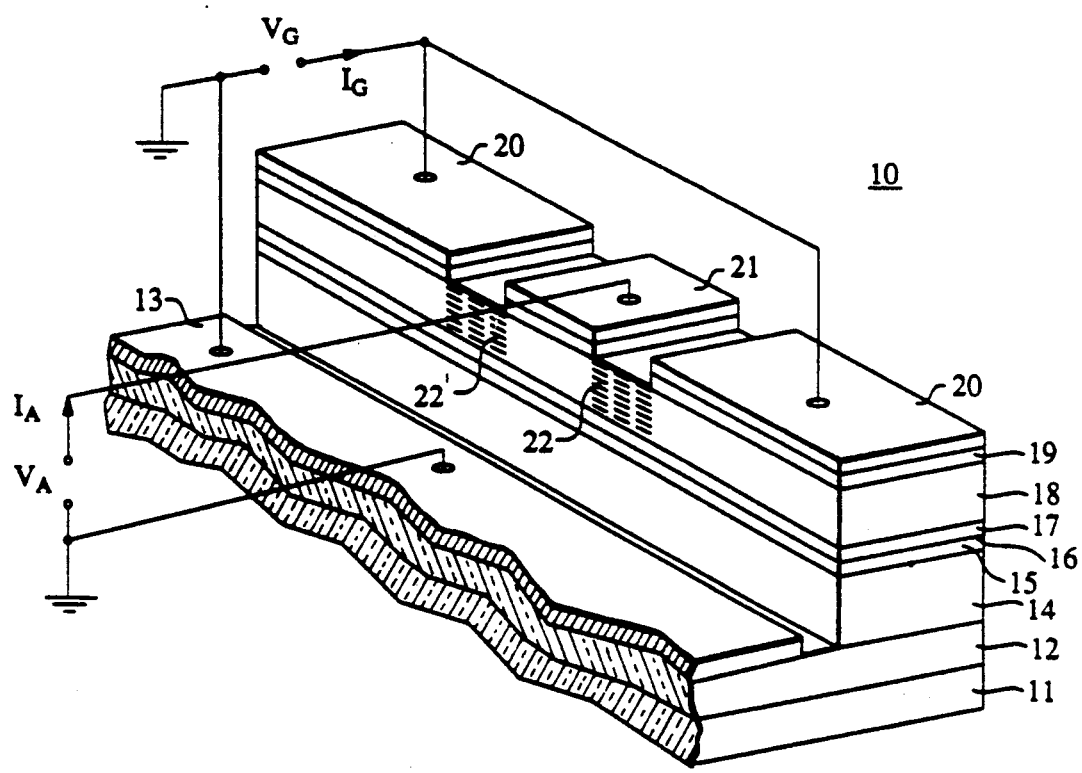
FIG. 1 schematically depicts an exemplary laser according to the invention.

FIG. 1 schematically depicts an exemplary laser 10 according to the invention. It is a GaAs-based gain guided graded index separate confinement heterostructure (GRINSCH) single quantum well (SQW) laser. However, the invention is not limited to this particular type of laser or material system. For instance, devices according to the invention can be embodied in other semiconductor systems (e.g., the InGaAsP/InP system), and can have more than one quantum well. Furthermore, the invention can be embodied in other laser types, e.g., buried heterostructure (BH) QW lasers, DFB lasers that use an external Bragg element, and lasers with etched facets rather than cleaved ones.

Laser 10 comprises semi-insulating <100>-oriented GaAs substrate 11, with layer 12 of n+ GaAs epitaxial therewith. A portion of 12 is covered by metal contact stripe 13, and another portion forms the substrate for epitaxial n AlGaAs layer 14. The about 11 nm thick GaAs quantum well 16 is sandwiched between two 200 nm thick graded epitaxial $Al_xGa_{1-x}As$ waveguide regions (15 and 17) in which x varies from 0.2 to 0.55, with x=0.2 being closest to 16. Atop layer 17 is epitaxial p AlGaAs layer 18, a portion of which is covered by segmented epitaxial p+ GaAs layer 19, which in turn is covered by a segmented metal contact stripe (20 and 21). Narrow gaps, exemplarily of width 2 $\mu$m, exist between 21 and the two portions of 20. The stripe has width W and overall length $L_C$, and segment 21 has length $L_A$. Significantly, at least in some embodiments, $L_C$ can be much greater than $L_A$, preferably $L_C/L_A > 10$ or even 20, resulting potentially in high speed devices, because of the small capacitance associated with the small $L_A$ and the usual reverse bias operation. The stripe segments 20 define the "gain" section of the device, and segment 21 defines the "loss" section. The latter is electrically isolated from the former. Exemplarily, isolation is due to oxygen implanted regions 22 and 22'. Care is taken to insure that the isolation implant does not extend to the active region of the device. The electrical resistance between the gain and loss sections advantageously is high, typically in excess of 3 or 10 k$\Omega$, preferably in excess of 100 k$\Omega$. By means of an oxygen isolation implant isolation in excess of 1M$\Omega$ is readily achievable, contributing to the potential for improved speed. Reflection coatings can be provided on both facets of the laser, as is well know to those skilled in the art.

FIG. 1 schematically depicts also means for electrically contacting the gain sections, and separate means for contacting the loss section. The voltage applied across, and current flowing through, the former are designated herein as $V_G$ and $I_G$, respectively and the voltage and current associated with the latter as $V_A$ and $I_A$, respectively. $I_G$ is frequently referred to as the injection current.

As will be readily appreciated by those skilled in the art, the layout of gain and loss sections does not have to be as shown. For instance, the gain section need not be in two equal parts but instead can be undivided, or consist of more than 2 parts. Furthermore, inventive devices need not have a single loss section.

Devices according to the invention can be produced by any appropriate technique, exemplarly by a process comprising molecular beam epitaxy (MBE), conventional photolithography and etching, and sputter deposition of metal layers. Advantageously, the segmented metal stripe is used as an etch mask for the underlying p+ layer and as an implant mask.

A laser with an intracavity monolithic loss section (or loss "modulator") as exemplified by the device of FIG. 1 can be Q-switched by changing the bias on the (typically reverse biased) loss section. The change in bias can result in a change in the radiation intensity emitted by the laser. We have discovered that, by making $L_A$ much smaller than $L_C$ ($L_C/L_A$ greater than 20), and providing a relatively high isolation resistance (more than 3 k$\Omega$, preferably more than 10 or 100 k$\Omega$) between the loss section and the gain section, it is possible to switch substantial light power with very small electrical power. Exemplarily, in a InGaAs/InP BH GRINSCH SQW laser (QW thickness d=16 nm, width of active region about 2 μm, gaps between loss section and gain sections 6 μm each, $L_A=6$ μm, $L_C=300$ μm, isolation resistance >3 kΩ) the light intensity was switched from about 8 mW to about 0.5 mW with a 30 mV change in $V_A$ ($I_G=80$ mA, $V_A\sim0$V). The total change in electrical power to the absorber section was about 30 μW.

The small size, low current drive, and low capacitance of the reverse biased loss section of at least some embodiments of the inventive devices allows high speed electrical modulation of lasing light output power by changing the electrical bias on the loss section while, typically, maintaining the injection current $I_G$ constant. Because of the low current drive, relatively small and unsophisticated high speed transistor designs may be used to drive the loss section, resulting in reduced cost and, typically, improved reliability.

High speed amplitude modulation of the laser output may also be achieved by optical pumping of the loss section of a laser according to the invention. In this embodiment also, $I_G$ is typically constant. Exemplarily, $V_A$ is also constant, and pump radiation pulses from another laser are caused to impinge on the loss section of the inventive laser. Significantly, the isolation implant used in preferred embodiments to electrically isolate the loss section from the gain section typically decreases the non-radiative lifetime of the optically created electron-hole pairs and therefore increases the pulse response speed.

Figure 7:
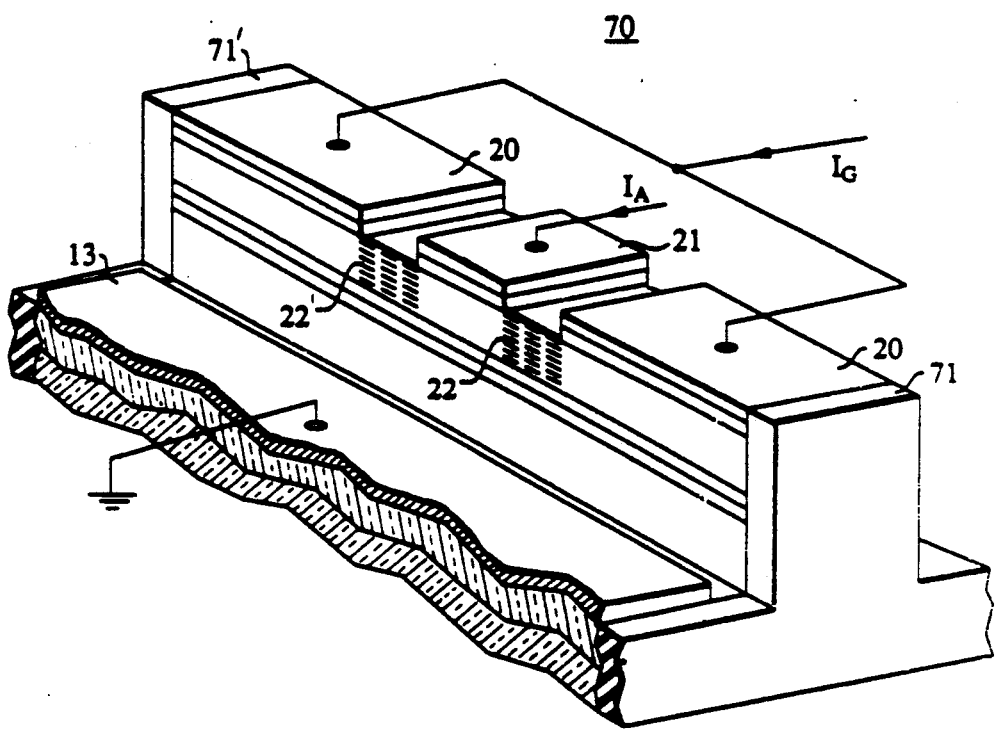
FIG. 7 depicts schematically a further particular embodiment of the invention, a variable gain optical amplifier.

Quantum well devices with an intracavity monolithic loss modulator can also be advantageously used as optical amplifiers. Such a device is schematically depicted in FIG. 7, wherein semiconductor body 70 has a structure substantially as shown in FIG. 1, except that antireflection coatings (71 and 71') are used instead. Such coatings are well know to those skilled in the art. Radiation of a given wavelength is caused to impinge on one of the facets of the amplifier, is amplified therein in a manner well known to those skilled in the art, is emitted from the other facet, and coupled into some appropriate utilization device (not shown). The degree of amplification can be varied by means of an electrical bias applied to the loss section of the device, optionally together with optical pumping of the loss section.

Such a laser amplifier has many advantageous features and many applications. The light output may be monitored and/or controlled by the loss section. Because operation of the device involves a single pass of photons through the structure, and because the loss section can be very short (of order 10 μm or even less), very high speed modulation of the amplifier output is possible. The inventive device can be used for voltage controlled pulse shaping of optical signals, or as a spatial light modulator. It can also be used advantageously in an integrated low noise detector, by using an amplifier section according to the invention in conjunction with a reverse biased p-i-n absorber section. When provided with a multiplicity of loss sections, the inventive amplifier can be used as an encoder/decoder or as a logic element, in a manner substantially analogous to that described below.

Figure 2:
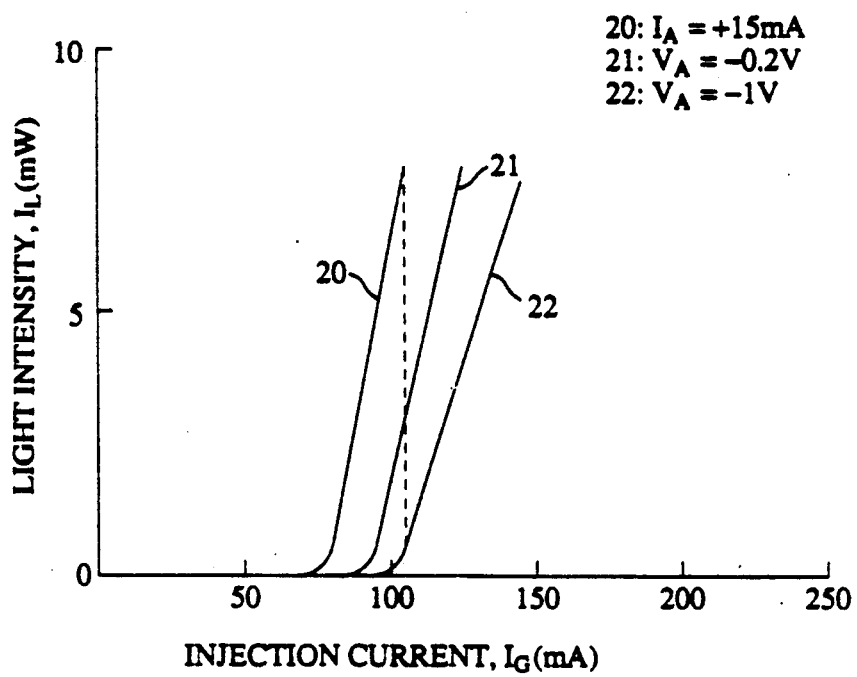
FIG. 2 gives exemplary values of emitted light intensity versus injection current, as a function of loss section bias.

In FIG. 2 are shown exemplary curves 20, 21, and 22 of light intensity per facet versus injection current $I_G$, for a laser according to the invention of the type shown in FIG. 1. The width W of the contact stripe was 20 μm, the overall cavity length $L_C$ was 500 μm, and the length $L_A$ of the loss section was 20 μm. For a fixed injection current, changing the bias on the loss section can result in a change in the output intensity. For instance, changing the bias from a small forward bias (resulting in $I_A=15$ mA) to a reverse bias ($V_A=-0.2$ and $-1.0$ V) reduces the output intensity from about 7.5 mW to about 2.5 and 0.5 mW, respectively. With $I_A=15$ mA, the threshold current $I_{th}$ was 80 mA and the lasing wavelength was 869 nm, corresponding to lasing electron transitions from the first (n=1) quantized state in the quantum well. The threshold current increased somewhat with increasing negative bias, possibly due to the quantum confined stark effect in the loss region and bandgap shrinkage in the gain region. The results of FIG. 2 demonstrate that, under appropriate operating conditions, lasers according to the invention can be efficiently amplitude modulated by reverse biasing of the loss section.

Figure 3:
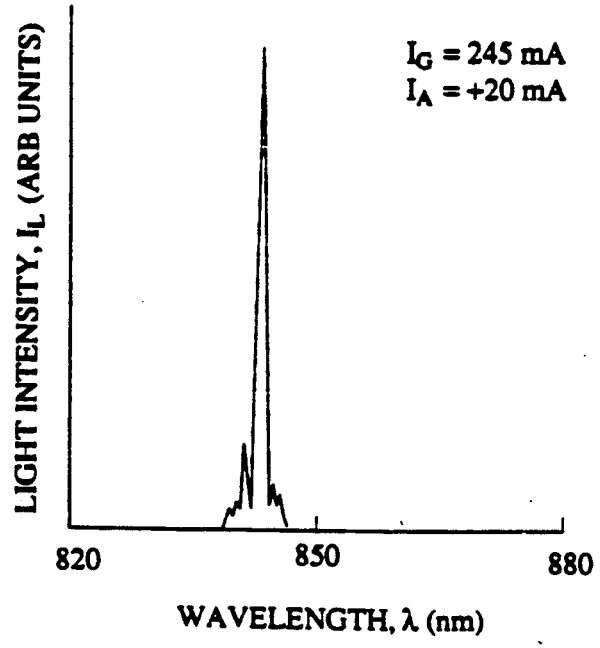
FIGS. 3 and 4 show exemplary data on emitted light intensity versus wavelength.
Figure 4:
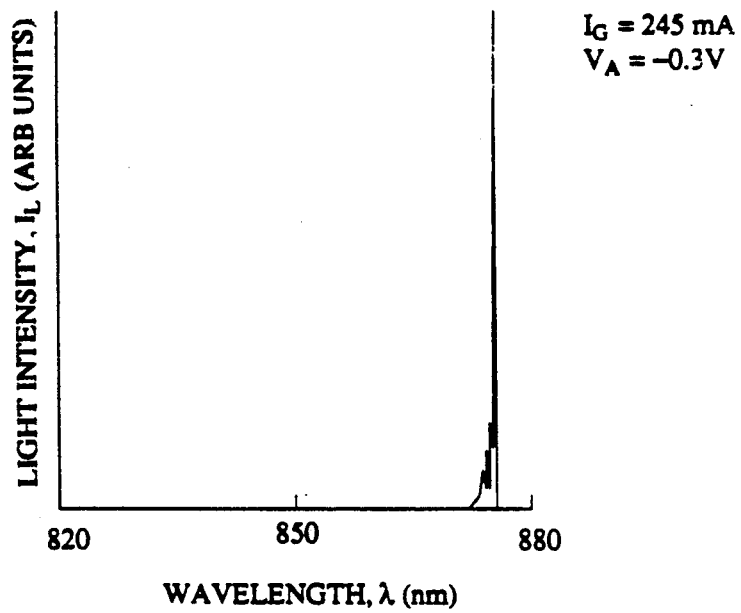

In FIGS. 3 and 4 are shown exemplary results of emitted light intensity versus wavelength, for an inventive laser of the type shown in FIG. 1. The laser had overall cavity length $L_C=400$ μm, $L_A=60$ μm, and stripe width W=6 μm. The device geometry was chosen to result in relatively lower gain (due to current spreading and lateral current diffusion), whereby under some bias conditions lasing occurred from the second sub-band (n=2) of the quantum well. In particular, FIG. 3 shows the emitted light intensity for injection current $I_G=245$ mA and a forward biased loss section ($I_A=20$ mA). Under these bias conditions the light intensity has a strong maximum at λ=842 nm, corresponding to lasing from the second sub-band. FIG. 4 shows that under different bias conditions, namely, reverse biased loss section ($V_A=-0.3$ V) the emitted intensity has a strong maximum at λ=875 nm, corresponding to lasing from the first sub-band. Lasing from both the first and second sub-bands is observed for intermediate bias conditions, e.g., for $I_A=2$ mA.

As is well known to those skilled in the art, the energy difference between the n=1 and n=2 sub-bands of a quantum well depends, inter alia, on the thickness of the well. Thus, the wavelength difference Δλ that can be obtained in devices according to the invention is a design variable. As FIGS. 3 and 4 demonstrate, Δλ can be relatively large, in excess of 30 nm. This is a significant advantage, as will be discussed below.

In the wavelength-switching embodiment of the invention, $|\lambda_1-\lambda_2|$ is at least 10 nm. This relatively large wavelength difference makes possible applications (e.g., information storage systems) not possible with prior art wavelength-switching lasers. In prior art devices (e.g., DFB lasers with an electrically controlled Bragg element) the maximum attainable Δλ typically is substantially less than 10 nm, frequently of the order of 1 nm.

Figure 5:
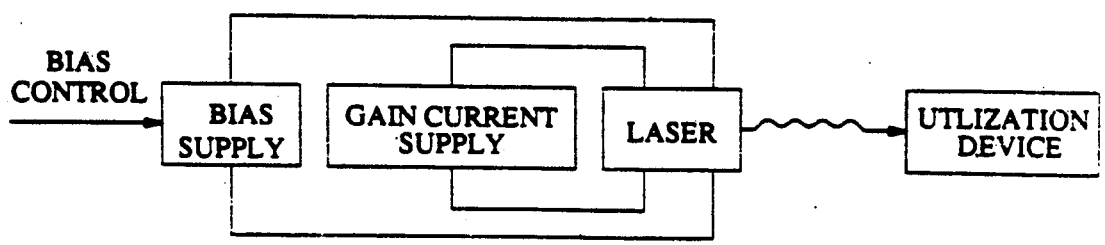
FIG. 5 depicts schematically apparatus according to the invention.

Exemplary apparatus according to the invention is schematically depicted in FIG. 5, wherein the inventive laser emits radiation of wavelength $\lambda_1$ or $\lambda_2$, depending on the bias conditions. The emitted radiation is received by a utilization device, e.g., a semiconductor detector on a separate or the same electronic assembly or subassembly, an optical disk or other optical storage medium, or an optical fiber. A gain current supply provides the injection current $I_G$ to the gain section of the laser, and a bias supply is electrically connected to the loss section. The bias conditions are set in response to a bias control signal.

Exemplarily, with $V_A=0$, $I_G$ is set to a value at or close to a critical current $I_{crit}$, whose value depends on various losses in gain in the structure. Application of forward bias to the loss section then results in lasing from one of the sub-bands of the quantum well (e.g., the first sub-band), and appropriate reverse bias can result in lasing from another sub-band (e.g., the second sub-band).

Figure 6:
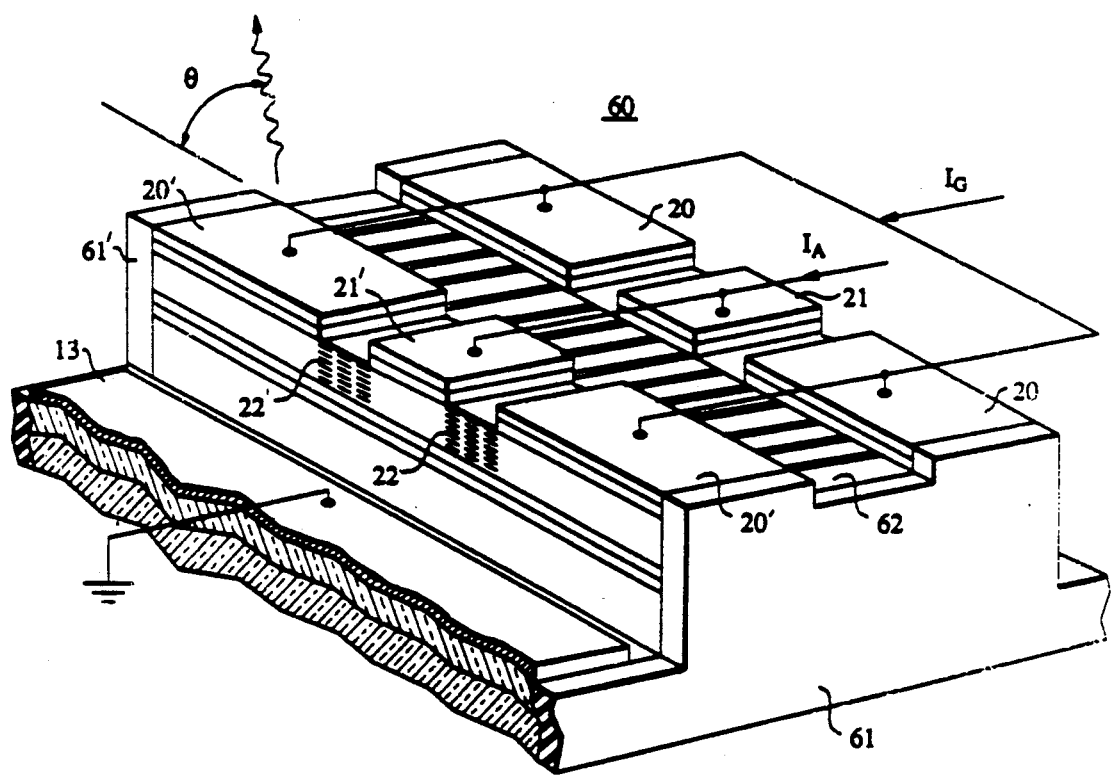
FIG. 6 schematically shows a particular embodiment of the invention, namely, a spatial light modulator.

The invention can take the form of a variety of embodiments. An exemplary one is schematically depicted in FIG. 6. The exemplary electrically controlled spatial light modulator 60 comprises a semiconductor body having a layer structure substantially as described in conjunction with FIG. 1, but comprising two sets of segmented p-contact stripes. In particular, the two gain section contacts (20 and 20') are electrically connected, as are the two loss section contacts (21 and 21'). Between the two segmented contact stripes is located a grating 62, the periodicity of the grating chosen such that radiation is efficiently coupled out into free space at a substantial angle $\theta$. For instance, for radiation of approximate wavelength 1.5 $\mu$m, a grating of approximate period 0.5 $\mu$m can result in $\theta$ of the order of 70°. Reflection coatings 61 and 61' are provided, with 61' chosen such that laser radiation is emitted from the associated facet. The direction of emission (i.e., the angle $\theta$ indicated in FIG. 6) depends on the wavelength of the laser radiation. Thus, causing, by means of a change in the bias conditions of the loss sections, a change in wavelength from $\lambda_1$ to $\lambda_2$ results in a change in $\theta$. An electrically controlled spatial light modulator has many applications, e.g., in optical scanning, light wave distribution circuits, and chip to chip optical interconnections between spatially separated electronic and/or opto-electronic subsystems or systems.

Exemplary of apparatus according to the invention is optical information storage apparatus that comprises a laser according to the invention, with the relatively long wavelength used to read information stored in an appropriate storage medium, and the relatively short wavelength used to write information into the medium, e.g., through production of electron-hole pairs, or through induction of a suitable chemical reaction.

Further exemplary apparatus according to the invention comprises an inventive laser with two (or possibly more) independently addressable loss sections. Such apparatus can be used to carry out logic operations, and has application in frequency keying optical data transmission. For instance, by associating the relatively long wavelength emission of the laser with logic 0 and the relatively short wavelength with logic 1, two loss sections (A and B) may be biased positive ($+V=0$) or negative ($-V=1$) such that for fixed $I_G$ the lasing light output has wavelength according to the truth table for AND, namely

| loss section | | output |
|---|---|---|
| A | B | wavelength |
| 0 | 0 | 0 |
| 1 | 0 | 0 |
| 1 | 0 | 0 |
| 0 | 1 | 0 |
| 1 | 1 | 1 |

For a somewhat larger injection current, the lasing output can have a wavelength according to the truth table for OR, namely

| loss section | | output |
|---|---|---|
| A | B | wavelength |
| 0 | 0 | 0 |
| 1 | 0 | 1 |
| 0 | 1 | 1 |
| 1 | 1 | 1 |

There are other logic functions that may be performed by the inventive optoelectronic device. For example, the thruth table for addition may be generated by defining the relatively long wavelength as the "sum" and the relatively short wavelength as the "carry", if the apparatus is designed such that reverse biasing both loss sections switches the laser off.

Since $\Delta\lambda$ can be relatively large in inventive lasers, it is frequently possible to use inexpensive filters and gratings in apparatus as described above. This is an obviously advantageous aspect of the invention.

In preferred embodiments the inventive device is co-located with electronic devices or sub-assemblies (e.g., means for causing flow of an electrical current through the gain section, and the means for applying an electrical bias to the loss section) on a common semiconductor substrate. Optionally, on the same substrate can be located other opto-electronic devices, e.g., detectors and/or another laser. Furthermore, the photocurrent flowing in the reverse biased loss section can be monitored by known means, and be used to regulate, via a feedback loop, the light output by changing one (or both) of $V_A$ and $I_G$. The means for accomplishing this regulation can advantageously also be integrated into the common substrate, as will be readily apparent to those skilled in the art.

EXAMPLE 1

On a (100)-oriented n-InP substrate epitaxial layers were grown by atmospheric pressure MOVPE (see T. Tanbun-Ek et al., *Applied Physics Letters*, Vol. 55, p. 819, incorporated herein by reference). First a 1 $\mu$m n-InP buffer layer was grown. The lower part of the GRINSCH layers, with 22 nm thick step-like undoped quaternary layers lattice matched to InP, with decreasing bandgap of 1.0 $\mu$m, 1.1 $\mu$m, 1.25 $\mu$m, 1.33 $\mu$m, was then grown. A single ternary quantum well, of thickness about 14 nm, was grown next. Following this, the upper part of the GRINSCH InGaAsP confining layers (bandgap increasing from 1.33 $\mu$m to 1.0 $\mu$m in 4 steps) was grown. This was followed by an InP setback layer to minimize effects of Zn diffusion from the upper cladding (50 nm, undoped), the p-InP cladding (1 $\mu$m), and the p-InGaAsP cap layer, which were grown subsequently. Using a technique substantially as described in T. Tanbun-Ek et al., *Electronics Letters*, Vol. 24, p. 1483 (incorporated herein by reference), a BH laser was fabricated. The width of the active region was reduced to about 2 $\mu$m, Fe-doped semi-insulating InP was regrown, and conventional metallization layers were deposited. The p-side contact was patterned, to result in 6 $\mu$m gaps between the single loss section and the two parts of the gain section. $L_A$ was 6 $\mu$m, and the device was cleaved to result in $L_C = 800$ $\mu$m. The thus produced laser was tested using conventional means. For $I_G = 250$ mA and $V_A = 0.3$ V, the output radiation had $\lambda = 1.51$ $\mu$m and was TE polarized. Changing $I_G$ to 330 mA and $V_A$ to $-0.4$ V resulted in output radiation of $\lambda = 1.46$, also TE polarized. The switching speed was limited by the electronics used.

EXAMPLE 2

A laser was fabricated substantially as described in Example 1, except that the laser comprised 4 quantum wells, and $L_A$ was about 30 μm. The wavelength of the output radiation could be switched, substantially as in Example 1, except that $\Delta\lambda$ was about 60 nm. Furthermore, the wavelength could be tuned (within a given sub-band) by varying $V_A$.

Figure 8:
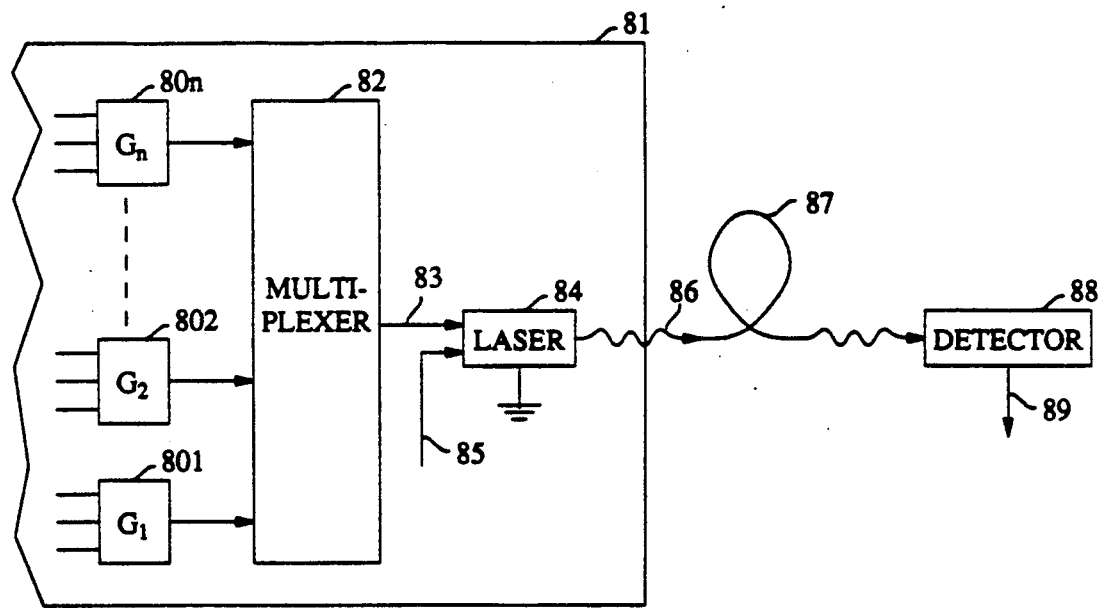
FIG. 8 schematically shows the relevant part of apparatus that comprises optical interconnection means according to the invention.

FIG. 8 schematically depicts the relevant portion of a particular preferred apparatus according to the invention. The apparatus comprises a multiplicity of (not necessarily identical) digital gates $G_1, G_2 \ldots G_n$, identified by numerals 801, 802, ... 80n on circuit board 81. The outputs of the n gates are combined in multiplexing means 82, with the multiplexed output signals 83 fed, without amplification, to the loss section of multi-electrode quantum well laser 84. To the laser is also supplied drive current 85 by means that are conventional and not shown. Gates and multiplexing means can also be conventional. The light (not necessarily visible) output 86 of laser 84, which is responsive to multiplexed signal 83, is coupled by conventional means into optical fiber 87, propagates through the fiber and is detected by one (or possibly more, not necessarily co-located) detectors 88. The detector or detectors can be conventional. The detector output 89 is fed to means, not shown, that are responsive to the output in conventional manner, exemplarily including multiplexing means.

What is claimed:

1. Apparatus comprising
   a) at least one digital electronic gate having an electrical output;
   b) a semiconductor laser comprising contact means, and having a radiation output that is responsive to an electrical signal applied to the contact means, the contact means being electrically connected, without intervening amplifier, to the gate such that the radiation output is responsive to the electrical output of the gate;
   c) detector means, and means adapted for impinging the radiation output of the laser onto the detector means, with the detector means having an electrical output; and
   d) means responsive to the detector means output, wherein
   e) the semiconductor laser is a quantum well laser comprising at least one gain section, and at least one loss section, with the contact means comprising loss section contact means and gain section contact means, and with the electrical output of the electronic gate being applied to the loss section contact means.

2. Apparatus of claim 1, comprising a multiplicity of digital gates and multiplexing means, each digital gate having an electrical output, the multiplicity of outputs applied to the multiplexing means, with the output of the multiplexing means applied to the loss section contact means.

3. Apparatus of claim 2, wherein the apparatus is an electronic switching machine.

* * * * *